United States Patent
Xu et al.

(10) Patent No.: US 10,241,339 B2
(45) Date of Patent: Mar. 26, 2019

(54) LASER PULSE DELAY SYSTEM AND LASER ANNEALING SYSTEM

(71) Applicant: Boe Technology Group Co., Ltd., Beijing (CN)

(72) Inventors: Xiaowei Xu, Beijing (CN); Xiaolong Li, Beijing (CN); Liangjian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 268 days.

(21) Appl. No.: 15/198,063

(22) Filed: Jun. 30, 2016

(65) Prior Publication Data
US 2017/0205633 A1    Jul. 20, 2017

(30) Foreign Application Priority Data

Jan. 15, 2016    (CN) .......................... 2016 1 0029044

(51) Int. Cl.
*G02B 27/14*    (2006.01)
*G02B 27/10*    (2006.01)
(Continued)

(52) U.S. Cl.
CPC ........ *G02B 27/144* (2013.01); *B23K 26/0006* (2013.01); *B23K 26/067* (2013.01);
(Continued)

(58) Field of Classification Search
CPC ............ B23K 26/0622; B23K 26/0006; B23K 26/067; B23K 26/0643; B23K 26/0626;
(Continued)

(56) References Cited

U.S. PATENT DOCUMENTS 6,314,119 B1 *   11/2001   Morton ................. H01S 3/0057
                                                    372/25
7,656,538 B2 *    2/2010   Paulus ............... G01N 21/4795
                                                    356/497
(Continued)

FOREIGN PATENT DOCUMENTS

CN        1431483        7/2003
CN      104181146       12/2014
(Continued)

OTHER PUBLICATIONS

Office Action from China Application No. 201610029044.6 dated Dec. 5, 2016.

*Primary Examiner* — Loha Ben
(74) *Attorney, Agent, or Firm* — Calfee, Halter & Griswold LLP

(57) ABSTRACT

The present disclosure discloses a laser pulse delay system and a laser annealing system. The laser pulse delay system comprises: a beam splitter, a first reflective unit and a delay unit. The beam splitter is configured to split a laser beam emitted by a laser into a first beam and a second beam, such that the first beam is transmitted to the first reflective unit and the second beam is transmitted to the delay unit. The first reflective unit is configured to reflect the first beam it receives, such that the reflected first beam is transmitted to a component to be irradiated. The delay unit is configured to delay the second beam it receives, such that the delayed second beam is transmitted to the component to be irradiated.

20 Claims, 2 Drawing Sheets

(51) Int. Cl.
  *G02B 26/02* (2006.01)
  *B23K 26/00* (2014.01)
  *B23K 26/067* (2006.01)
  *B23K 26/0622* (2014.01)
  *H01L 21/268* (2006.01)
  *B23K 26/06* (2014.01)
  *H01S 3/00* (2006.01)
  *B23K 103/00* (2006.01)
  *H01S 3/10* (2006.01)
  *G02B 17/02* (2006.01)

(52) U.S. Cl.
  CPC ...... *B23K 26/0622* (2015.10); *B23K 26/0643* (2013.01); *G02B 26/02* (2013.01); *G02B 27/106* (2013.01); *H01L 21/268* (2013.01); *H01S 3/0057* (2013.01); *B23K 2103/56* (2018.08); *G02B 17/023* (2013.01); *H01S 3/10* (2013.01)

(58) Field of Classification Search
  CPC ............. B23K 26/064; B23K 26/0648; B23K 26/0604; B23K 26/705; B23K 2203/56; G02B 26/02; G02B 27/10; G02B 27/106; G02B 27/14; G02B 27/144; H01L 21/268; H01S 3/005; H01S 3/0057; H01S 3/10; H01S 3/10092; H01S 3/1305; H01S 3/225; H01S 3/2333; G01N 21/31; G01N 21/4795
  USPC ........ 359/264, 618, 629, 636; 315/150, 151, 315/155, 156; 372/20, 25, 26, 57, 92, 99; 355/67; 250/492.1
  See application file for complete search history.

(56) References Cited

U.S. PATENT DOCUMENTS

| | | | | |
|---|---|---|---|---|
| 7,715,459 | B2* | 5/2010 | Brown | G03F 7/70025 372/22 |
| 8,440,581 | B2* | 5/2013 | Im | B23K 26/0081 257/66 |
| 8,598,490 | B2* | 12/2013 | Hooper | H01L 21/6836 219/121.69 |
| 8,630,322 | B2* | 1/2014 | Dantus | H01S 3/0057 372/24 |
| 8,816,302 | B2* | 8/2014 | Mei | B01J 19/121 250/492.1 |
| 8,908,735 | B2* | 12/2014 | Ershov | H01S 3/225 372/57 |

FOREIGN PATENT DOCUMENTS

| | | |
|---|---|---|
| CN | 104347368 | 2/2015 |
| CN | 104766813 | 7/2015 |
| JP | H1126851 | 1/1999 |
| JP | 2006071855 | 3/2006 |

* cited by examiner

LASER PULSE DELAY SYSTEM AND LASER ANNEALING SYSTEM

CROSS REFERENCE TO RELEVANT APPLICATIONS

The present disclosure claims the benefit of Chinese Patent Application No. 201610029044.6, filed on Jan. 15, 2016, the whole disclosure of which is incorporated by reference herein.

FIELD

The present disclosure relates to the field of laser pulse, and in particular to a laser pulse delay system and a laser annealing system.

BACKGROUND ART

Currently, with a further study and development of laser techniques, lasers are applied more and more widely as their performances are further improved and their costs are gradually reduced. However, during the application of laser pulses, since the irradiation duration is very short, it is necessary to perform multiple overlapped irradiations with laser pulses. Meanwhile, with respect to operations less demanding on energy, it may be necessary to filter out part of the energy, which results in waste of the energy.

For example, in active-matrix organic light emitting diode (AMOLED) display screen techniques, low temperature polysilicon thin film transistors having higher carrier mobility are generally used for driving. An approach of laser annealing is often adopted for the manufacture of polysilicon. In other words, when an amorphous silicon thin film is irradiated by an excimer laser, the amorphous silicon will be molten after laser irradiation and re-crystallized into polysilicon. Taking laser pulses of 500 KHz as an example, each pulse occupies 28 ns, leaving the rest 1972 ns empty. Since grains obtained during the irradiation duration (28 ns) have a very small size, overlapped irradiation is required in order to obtain a larger grain size. At the same time, energy of a laser light is usually far higher than energy required for melting the amorphous silicon, so it is necessary to filter out part of the laser energy by means of an attenuation device. Therefore, there is a technical need for solving the following problems in the prior art: how to prolong the irradiation duration of laser pulses as much as possible without changing internal structure of the laser; as well as how to re-utilize redundant laser energy for operations less demanding on energy so as to improve the utilization for operating energy of the laser light.

SUMMARY

Embodiments of the present disclosure provide a laser pulse delay system and a laser annealing system, so as to at least partially eliminate or alleviate one or more issues mentioned above.

The embodiments of the present disclosure provide a laser pulse delay system comprising: a beam splitter, a first reflective unit and a delay unit. The beam splitter is configured to split a laser beam emitted by a laser into a first beam and a second beam, such that the first beam is transmitted to the first reflective unit and the second beam is transmitted to the delay unit. The first reflective unit is configured to reflect the first beam it receives, such that the reflected first beam is transmitted to a component to be irradiated. The delay unit is configured to delay the second beam it receives, such that the delayed second beam is transmitted to the component to be irradiated. In one laser pulse cycle, a total pulse duration of laser beams irradiating the component to be irradiated is longer than a pulse duration of laser beams emitted by the laser.

Since a beam splitter is arranged in the laser pulse delay system of the present disclosure, a laser beam emitted by the laser can be split into a first beam and a second beam. The first beam is transmitted to a component to be irradiated after reflection by the first reflective unit, and the second beam is transmitted to the component to be irradiated after delay by the delay unit. In this case, the two split beams can irradiate the component to be irradiated respectively, and in one laser pulse cycle, a total pulse duration of laser beams irradiating the component to be irradiated is longer than a pulse duration of laser beams emitted by the laser. In this way, not only is the irradiation duration of the laser within each laser pulse cycle prolonged, but also the energy of the laser beam is sufficiently utilized, thus improving the utilization for the operating energy of the laser light.

Optionally, the beam splitter is a transflective mirror.

Optionally, transmission optical paths for the first beam and the second beam are perpendicular to each other.

Optionally, the first beam is a reflected light generated after the laser beam passes through the transflective mirror, and the second beam is a transmitted light generated after the laser beam passes through the transflective mirror. Alternatively, the first beam is a transmitted light generated after the laser beam passes through the transflective mirror, and the second beam is a reflected light generated after the laser beam passes through the transflective mirror.

Optionally, the first reflective unit is configured as a mirror, such that the reflected first beam is transmitted to the component to be irradiated after transmission or reflection by the beam splitter.

Optionally, the delay unit comprises: a second reflective unit and a driving unit for driving the second reflective unit to rotate in a periodic trajectory. The second reflective unit comprises an opening and a reflective surface for reflecting the second beam inside the second reflective unit. The opening of the second reflective unit is configured such that the second beam is incident into the second reflective unit and that the second beam reflected and delayed in the second reflective unit is emitted to the beam splitter, so as to be transmitted to the component to be irradiated after transmission or reflection by the beam splitter.

Optionally, when the second beam which has been reflected and delayed is emitted from the second reflective unit, the opening of the second reflective unit is located in a same position as it was when the second beam was incident into the second reflective unit.

Optionally, an area of the opening region is not smaller than a spot area of the laser beam.

Optionally, the second reflective unit is provided with fillers inside.

Optionally, the filler is water, a transparent liquid solvent or a transparent solid.

Optionally, the second reflective unit is in a cylindrical shape and its reflective surface is an inner side surface of the cylindrical shape.

Optionally, a rotation cycle of the second reflective unit is $4rnk/c$, wherein k is an even number, c is a motion velocity of light in vacuum, n is a refractive index of the filler, and r is a radius of the second reflective unit.

The embodiments of the present disclosure further provide a laser annealing system comprising: a laser for emitting a laser beam, the laser pulse delay system provided in the embodiments of the present disclosure, and a substrate to be laser-annealed.

DETAILED DESCRIPTION OF EMBODIMENTS

Technical solutions in the embodiments of the present disclosure shall be described clearly and completely in the following with reference to the drawings. Apparently, the embodiments described below are only a part of the embodiments of the present disclosure, rather than all of them. Based on the embodiments in the present disclosure, all other embodiments obtainable by a person having ordinary skills in the art without inventive efforts shall fall within the scope of the present disclosure.

Figure 1:
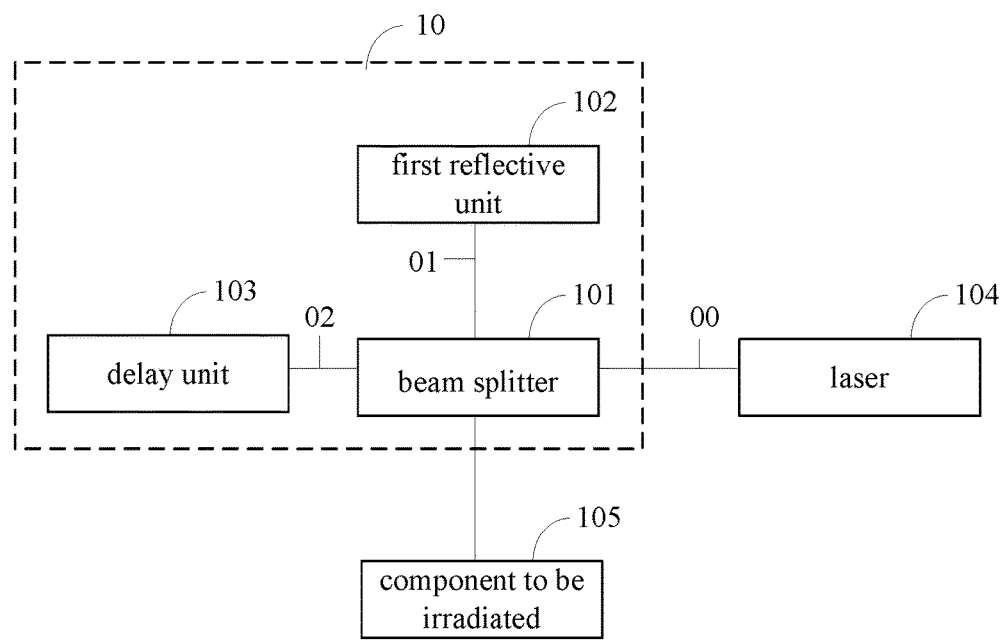
FIG. 1 is a schematic structural view of a laser pulse delay system provided in the embodiments of the present disclosure.

Referring to FIG. 1, a schematic structural view of a laser pulse delay system provided in the embodiments of the present disclosure is shown. Specifically, a laser pulse delay system 10 comprises: a beam splitter 101, a first reflective unit 102 and a delay unit 103. The beam splitter 101 is configured to split a laser beam 00 emitted by a laser 104 into a first beam 01 and a second beam 02, such that the first beam 01 is transmitted to the first reflective unit 102 and the second beam 02 is transmitted to the delay unit 103. The first reflective unit 102 is configured to reflect the first beam 01 it receives, such that the reflected first beam is transmitted to a component to be irradiated 105. The delay unit 103 is configured to delay the second beam 02 it receives, such that the delayed second beam is transmitted to the component to be irradiated 105. In one laser pulse cycle, a total pulse duration of laser beams irradiating the component to be irradiated 105 is longer than a pulse duration of laser beams emitted by the laser 104.

It should be noted that the laser pulse delay system 10 can be applied in a laser. When it is necessary to irradiate a component to be irradiated by a laser, the laser beams emitted by the laser are delayed by the laser pulse delay system 10 and then irradiate the component to be irradiated. The component to be irradiated refers to an object to be irradiated by laser light, which can be selected upon actual needs. For example, in laser annealing, the component to be irradiated is namely a substrate to be laser-annealed.

In an embodiment, since a beam splitter 101 is arranged in the laser pulse delay system 10 of the present disclosure, a laser beam 00 emitted by the laser 104 can be split into a first beam 01 and a second beam 02. The first beam 01 is transmitted to a component to be irradiated 105 after reflection by the first reflective unit 102, and the second beam 02 is transmitted to the component to be irradiated 105 after delay by the delay unit 103. In this case, the two split beams can irradiate the component to be irradiated 105 respectively, and in one laser pulse cycle, a total pulse duration of laser beams irradiating the component to be irradiated 105 (i.e., the sum total of irradiation durations of the first beam 01 and the second beam 02) is longer than a pulse duration of laser beams emitted by the laser 104. In this way, not only is the irradiation duration of the laser 104 within each laser pulse cycle prolonged, but also the energy of the laser beam is sufficiently utilized, thus improving the utilization for the operating energy of the laser light.

Specifically, a delay time for which the second beam 02 is delayed by the delay unit 103 can be adjusted upon needs. The first beam 01 and the second beam 02 into which the laser beam 00 emitted by the laser 104 is split will irradiate the component to be irradiated 105 at different times respectively.

In specific embodiments, immediately after irradiation by the first beam 01, the second beam 02 irradiates the component to be irradiated 105, i.e., there is no time interval between them, which is equivalent to a case in which the component to be irradiated 105 is irradiated continuously. Alternatively, there is a time interval between them, but they are still within one pulse cycle. In other words, a laser beam within one pulse cycle is split into two, which irradiate the component to be irradiated 105 respectively. By doing this, not only is the irradiation duration of the laser 104 within a pulse cycle prolonged, but also the energy of the laser beam is sufficiently utilized, thus improving the utilization for the operating energy of the laser light. Besides, the time interval between irradiations of the component to be irradiated 105 by the first beam 01 and by the second beam 02 can be made larger. For example, by adjusting the delay time, the second beam 02 within the pulse cycle is made to overlap the first beam in a next pulse cycle. In other words, part of the energy of a laser beam emitted within a pulse cycle and part of the energy of a laser beam emitted within a next pulse cycle are combined, such that the energy of laser beams irradiating the component to be irradiated 105 is more uniform.

Figure 2:
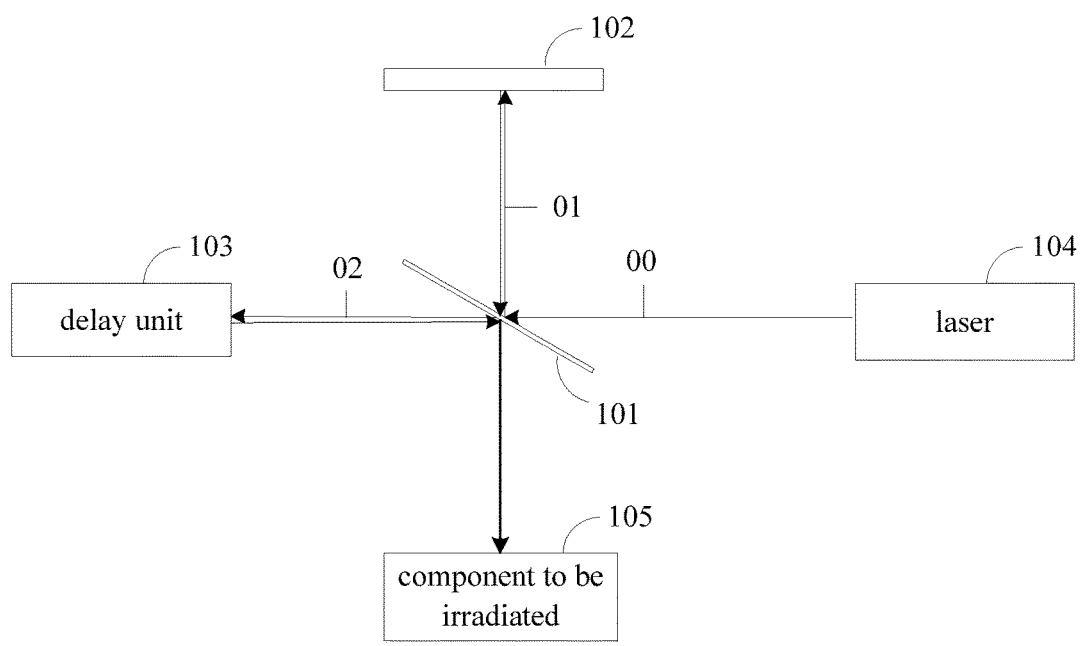
FIG. 2 is a schematic view of optical path transmission for a laser pulse delay system provided in the embodiments of the present disclosure.

In order to explain possible implementations of the laser pulse delay system 10 provided in the embodiments of the present disclosure more clearly, referring to FIG. 2, a schematic view of optical path transmission for a laser pulse delay system provided in the embodiments of the present disclosure is shown. Specifically, the beam splitter functions to split a laser beam emitted by the laser into two beams. Optionally, the beam splitter 101 is a transflective mirror. Further optionally, the transflective mirror is disposed to enclose an angle of 45° with the laser beam 00 emitted by the laser. In the embodiments, the angle can be adjusted upon needs.

In an embodiment, either of the two beams after beam splitting by the transflective mirror is transmitted to the first reflective unit 102, and the other is transmitted to the delay unit 103, wherein the angle enclosed between the two beams is 90°. Further optionally, after beam splitting by the transflective mirror, the transmission optical paths for the first beam 01 and the second beam 02 are perpendicular to each other.

Furthermore, either of the two beams after beam splitting by the transflective mirror is a transmitted light of the laser beam 00 emitted by the laser after passing through the transflective mirror, and the other is a reflected light of the laser beam 00 emitted by the laser after passing through the transflective mirror. Optionally, the first beam 01 is a reflected light generated after the laser beam passes through the transflective mirror, and the second beam 02 is a transmitted light generated after the laser beam passes through the transflective mirror. Alternatively, the first beam 01 is a transmitted light generated after the laser beam passes through the transflective mirror, and the second beam 02 is a reflected light generated after the laser beam passes through the transflective mirror. As shown in FIG. 2, the first beam 01 is a reflected light, and the second beam 02 is a transmitted light.

In other words, positions of the first reflective unit 102 and the delay unit 103 in FIG. 2 are exchangeable. Specifically, by adjusting positions of the transflective mirror and the laser, the beam transmitted to the first reflective unit 102 can be made a transmitted light, and the beam transmitted to the delay unit 103 can be made a reflected light.

In an embodiment, a mirror is used as the first reflective unit 102. Optionally, the first reflective unit 102 is a mirror. In this case, the reflected first beam is transmitted to the component to be irradiated 105 after transmission (alternatively, reflection) by the beam splitter 101. As shown in FIG. 2, the laser beam 00 emitted by the laser is transmitted to the first reflective unit 102 after passing through the transflective mirror (i.e., the first beam 01), then transmitted to the beam splitter 101 after reflection, and then transmitted to the component to be irradiated 105 after transmission by the beam splitter 101.

Figure 3:
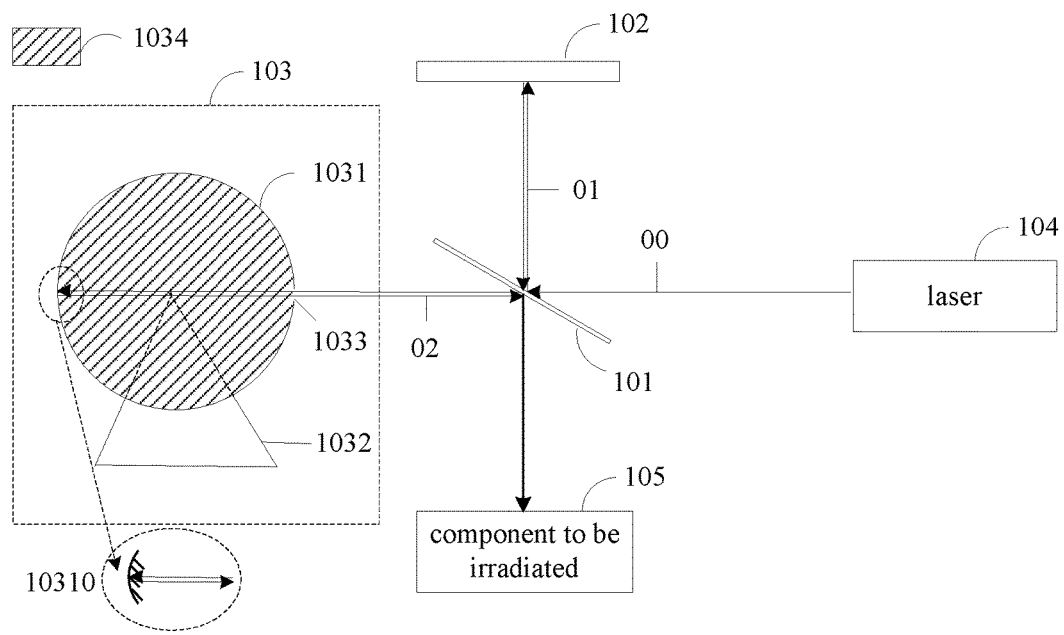
FIG. 3 is a schematic view of a general structure for a laser pulse delay system provided in the embodiments of the present disclosure.

The delay unit mainly functions to delay the laser beam it receives, and it can be any device capable of delaying light beams. Referring to FIG. 3, a schematic view of a general structure for a laser pulse delay system provided in the embodiments of the present disclosure is shown, wherein a dashed block indicates the delay unit 103.

Optionally, the delay unit 103 comprises: a second reflective unit 1031 and a driving unit 1032 for driving the second reflective unit to rotate in a periodic trajectory. The second reflective unit comprises an opening 1033 and a reflective surface 10310, such as a reflective inner surface, for reflecting the second beam 02 inside the second reflective unit. The opening of the second reflective unit is configured such that the second beam 02 is incident into the second reflective unit 1031 and that the second beam 02 reflected and delayed in the second reflective unit is emitted to the beam splitter 101, so as to be transmitted to the component to be irradiated 105 after transmission (alternatively, reflection) by the beam splitter 101. Specifically, when the second beam 02 which has been reflected and delayed is emitted from the second reflective unit 1031, the opening of the second reflective unit 1031 is located in a same position as it was when the second beam 02 was incident into the second reflective unit 1031.

In an embodiment, the delay unit 103 comprises a second reflective unit 1031 capable of delaying the beam and a driving unit 1032 that drives the second reflective unit 1031 to rotate in a periodic trajectory. The main operating principle of the delay unit 103 is as follows: the driving unit 1032 drives the second reflective unit 1031 to rotate with reference to a rotating axis; during rotation, the opening 1033 in the second reflective unit 1031 is used for receiving a beam to be delayed (i.e., the second beam 02 split out from the splitter), and reflecting the beam reciprocally on the reflective surface inside the second reflective unit with rotation of the second reflective unit 1031; when the opening 1033 rotates to the same position where it was when the second beam was incident (i.e., the position in which it receives the beam), the second beam 02 reflected and delayed in the second reflective unit 1031 is emitted to the beam splitter 101, so as to be transmitted to the component to be irradiated 105 after transmission (alternatively, reflection) by the beam splitter 101.

Specifically, by a periodic trajectory, we mean that the second reflective unit 1031 rotates in a preset fixed trajectory during rotation. For example, it rotates clockwise or counterclockwise. Moreover, the opening 1033 in the second reflective unit 1031 will pass the same position where it was when the second beam was incident, such that the second beam reflected and delayed in the second reflective unit 1031 can be emitted from the opening 1033 to the beam splitter.

Optionally, in order to allow the laser beam to be successfully incident into the second reflective unit 1031 and successfully emitted out after delay, an area of the opening region is not smaller than a spot area of the laser beam.

In an embodiment, in order to further adjust the delay time without increasing the volume of the second reflective unit 1031, the second reflective unit 1031 can be provided with fillers 1034 inside, which are capable of influencing the transmission velocity of the laser beam. Optionally, the second reflective unit is provided with fillers 1034 inside. Optionally, the filler 1034 is water, a transparent liquid solvent or a transparent solid.

In an embodiment, optionally, in order to enable the laser beam to be delayed to be reflected horizontally on the reflective surface inside the second reflective unit 1031 such that a delayed laser beam (i.e., the second beam 02) can be incident and emitted out in a same position, as shown in FIG. 3, the second reflective unit is in a cylindrical shape and its reflective surface is an inner side surface of the cylindrical shape. Furthermore, a rotation cycle of the second reflective unit is 4 rnk/c, wherein k is an even number, c is a motion velocity of light in vacuum, n is a refractive index of the filler, and r is a radius of the second reflective unit.

In other words, when the second reflective unit is in a cylindrical shape and its reflective surface is an inner side surface of the cylindrical shape, a rotation cycle of the second reflective unit is 4rnk/c, wherein k represents the number of reflections for the laser beam inside the second reflective unit. In order to enable the delayed laser beam to be emitted out when the opening rotates to the same position, the value of k takes an even number. In an embodiment, by adjusting the type of the filler, the radius of the second reflective unit and so on, the rotation cycle of the second reflective unit can be changed, and thereby the delay time can be adjusted. When the second reflective unit is not provided with fillers (which is equivalent to a case in which only air is provided), the value of n takes 1.

In specific embodiments, the second reflective unit and the reflective surface thereof can also be in other shapes, as long as the delayed laser beam can be transmitted to the component to be irradiated 105 by adjusting positions of each device and unit. Specifically, the delayed laser beam can also be transmitted to the component to be irradiated 105 without reflection by the beam splitter. Many other approaches can be adopted, such as directly transmitting the delayed laser beam to the component to be irradiated 105, or transmitting the delayed laser beam to the component to be irradiated 105 with a addition of a new mirror. The embodiments of the present disclosure only provide a schematic view of an exemplary structure which can be implemented, but do not indicate that the laser pulse delay system of the present disclosure only has such a structure.

Based on a same concept, the embodiments of the present disclosure also provide a laser annealing system. The laser annealing system comprises: a laser for emitting a laser beam, any of the laser pulse delay system provided in the embodiments of the present disclosure, and a substrate to be laser-annealed. Since the principle for solving problems by the laser annealing system is similar to that of a laser pulse delay system of the present disclosure, the implementation of the laser pulse delay system can be referred to that of the laser annealing system, and no more details about repetitive parts shall be provided for simplicity.

Figure 4:
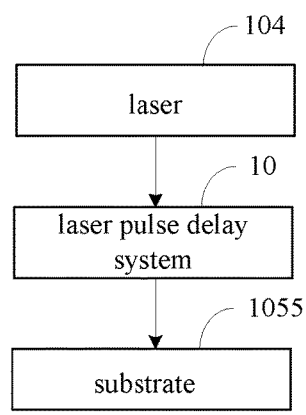
FIG. 4 is a schematic structural view of a laser annealing system provided in the embodiments of the present disclosure.

Referring to FIG. 4, a schematic structural view of a laser annealing system provided in the embodiments of the present disclosure is shown. Specifically, the laser annealing system comprises: a laser 104, a laser pulse delay system 10, and a substrate 1055 to be laser-annealed. Furthermore, the laser beam emitted by the laser 104 is transmitted to the substrate 1055 after passing through the laser pulse delay system 10.

In the prior art, since the irradiation duration is very short, grains obtained therefrom have a very small size when a laser is used for laser annealing, and hence overlapped irradiation is required in order to obtain a larger grain size. At the same time, energy of a laser beam emitted by a laser is usually far higher than energy required for melting the amorphous silicon, so it is necessary to filter out part of the laser energy by means of an attenuation device. While for the laser annealing system in the embodiments of the present disclosure, since the laser pulse delay system provided in the embodiments of the present disclosure is added, the part of energy filtered out can be made to irradiate the amorphous silicon after being delayed. In other words, the laser annealing system in the embodiments of the present disclosure can split a laser beam emitted by the laser into a first beam and a second beam. The first beam is transmitted to the substrate to be laser-annealed after reflection by the first reflective unit. The second beam is transmitted to the substrate to be laser-annealed after delay by the delay unit. In this way, not only is the total pulse duration of laser beams irradiating the substrate to be laser-annealed within a laser pulse cycle is prolonged, but also the grain size obtainable within a certain cycle can be improved as compared with the prior art, thereby obtaining a higher production efficiency.

To sum up, since a beam splitter is arranged in the laser pulse delay system of the present disclosure, a laser beam emitted by the laser can be split into a first beam and a second beam. The first beam is transmitted to a component to be irradiated after reflection by a first reflective unit, and the second beam is transmitted to the component to be irradiated after delay by the delay unit. In this case, the two split beams can irradiate the component to be irradiated respectively, and in one laser pulse cycle, a total pulse duration of laser beams irradiating the component to be irradiated is longer than a pulse duration of laser beams emitted by the laser. In this way, not only is the duration of the laser within each laser pulse cycle prolonged, but also the energy of the laser beam is sufficiently utilized, thus improving the utilization of the operating energy of the laser light.

Obviously, those skilled in the art can make various modifications and variations to the present disclosure without departing from the spirit and scope of the present disclosure. Thus if the modifications and variations to the present disclosure fall within the scopes of the claims of the present disclosure and the equivalent techniques thereof, the present disclosure is intended to include them too.

The invention claimed is:

1. A laser pulse delay system comprising: a beam splitter, a first reflective unit and a delay unit, wherein:
the beam splitter is configured to split a laser beam emitted by a laser into a first beam and a second beam, such that the first beam is transmitted to the first reflective unit and the second beam is transmitted to the delay unit;
the first reflective unit is configured to reflect the first beam it receives, such that the reflected first beam is transmitted to a component to be irradiated;
the delay unit is configured to delay the second beam it receives, such that the delayed second beam is transmitted to the component to be irradiated; and
in one laser pulse cycle, a total pulse duration of laser beams irradiating the component to be irradiated is longer than a pulse duration of laser beams emitted by the laser.

2. The laser pulse delay system according to claim 1, wherein the beam splitter is a transflective mirror.

3. The laser pulse delay system according to claim 2, wherein transmission optical paths for the first beam and the second beam are perpendicular to each other.

4. The laser pulse delay system according to claim 2, wherein: the first beam is a reflected light generated after the laser beam passes through the transflective mirror, and the second beam is a transmitted light generated after the laser beam passes through the transflective mirror; or,
the first beam is a transmitted light generated after the laser beam passes through the transflective mirror, and the second beam is a reflected light generated after the laser beam passes through the transflective mirror.

5. The laser pulse delay system according to claim 2, wherein the first reflective unit is configured as a mirror, such that the reflected first beam is transmitted to the component to be irradiated after transmission or reflection by the beam splitter.

6. The laser pulse delay system according to claim 2, wherein: the delay unit comprises: a second reflective unit and a driving unit for driving the second reflective unit to rotate in a periodic trajectory, wherein:
the second reflective unit comprises an opening and a reflective surface for reflecting the second beam inside the second reflective unit; and
the opening of the second reflective unit is configured such that the second beam is incident into the second reflective unit and that the second beam reflected and delayed in the second reflective unit is emitted to the beam splitter, so as to be transmitted to the component to be irradiated after transmission or reflection by the beam splitter.

7. The laser pulse delay system according to claim 6, wherein, when the second beam which is reflected and delayed is emitted from the second reflective unit, the opening of the second reflective unit is located in a same position as it was when the second beam was incident into the second reflective unit.

8. The laser pulse delay system according to claim 6, wherein an area of a region of the opening is not smaller than a spot area of the laser beam.

9. The laser pulse delay system according to claim 6, wherein the second reflective unit is provided with the filler inside.

10. The laser pulse delay system according to claim 9, wherein the filler is water, a transparent liquid solvent or a transparent solid.

11. The laser pulse delay system according to claim 9, wherein the second reflective unit is in a cylindrical shape and its reflective surface is an inner side surface of the cylindrical shape.

12. The laser pulse delay system according to claim 11, wherein a rotation cycle of the second reflective unit is $4rnk/c$, wherein k is an even number, c is a motion velocity of light in vacuum, n is a refractive index of the filler, and r is a radius of the second reflective unit.

13. A laser annealing system, comprising: a laser for emitting a laser beam, the laser pulse delay system according to claim 1, and a substrate to be laser-annealed.

14. The laser annealing system according to claim 13, wherein the beam splitter is a transflective mirror.

15. The laser annealing system according to claim 14, wherein transmission optical paths for the first beam and the second beam are perpendicular to each other.

16. The laser annealing system according to claim 14, wherein: the first beam is a reflected light generated after the laser beam passes through the transflective mirror, and the second beam is a transmitted light generated after the laser beam passes through the transflective mirror; or, the first beam is a transmitted light generated after the laser beam passes through the transflective mirror, and the second beam is a reflected light generated after the laser beam passes through the transflective mirror.

17. The laser annealing system according to claim 14, wherein the first reflective unit is configured as a mirror, such that the reflected first beam is transmitted to the component to be irradiated after transmission or reflection by the beam splitter.

18. The laser annealing system according to claim 14, wherein the delay unit comprises: a second reflective unit and a driving unit for driving the second reflective unit to rotate in a periodic trajectory, wherein:

the second reflective unit comprises an opening and a reflective surface for reflective the second beam inside the second reflective unit; and the opening of the second reflective unit is configured such that the second beam is incident into the second reflective unit and that the second beam reflected and delayed in the second reflective unit is emitted to the beam splitter, so as to be transmitted to the component to be irradiated after transmission or reflection by the beam splitter.

19. The laser annealing system according to claim 18, wherein, when the second beam which is reflected and delayed is emitted from the second reflective unit, the opening of the second reflective unit is located in a same position as it was when the second beam was incident into the second reflective unit.

20. The laser annealing system according to claim 18, wherein an area of a region of the opening is not smaller than a spot area of the laser beam.

* * * * *